United States Patent
Lu et al.

(10) Patent No.: US 8,565,034 B1
(45) Date of Patent: Oct. 22, 2013

(54) VARIATION COMPENSATION CIRCUITRY FOR MEMORY INTERFACE

(75) Inventors: Sean Shau-Tu Lu, San Jose, CA (US); Joseph Huang, Morgan Hill, CA (US); Yan Chong, San Jose, CA (US); Pradeep Nagarajan, Santa Clara, CA (US); Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 72 days.

(21) Appl. No.: 13/249,954

(22) Filed: Sep. 30, 2011

(51) Int. Cl.
G11C 7/00 (2006.01)
G11C 7/22 (2006.01)

(52) U.S. Cl.
CPC .................. G11C 7/22 (2013.01)
USPC ... 365/193; 365/194; 365/189.05; 365/233.1; 365/233.11; 365/233.12

(58) Field of Classification Search
USPC ............ 365/193, 194, 189.05, 233.1, 233.11, 365/233.12
See application file for complete search history.

(56) References Cited

U.S. PATENT DOCUMENTS 7,475,315 B1   1/2009   Natarajan et al.
7,590,879 B1 *  9/2009   Kim et al. ................... 713/401
2007/0239379 A1  10/2007  Newcomb et al.
2009/0031091 A1   1/2009  Chang et al.
2010/0180143 A1   7/2010  Ware et al.
2010/0315119 A1  12/2010  Welker et al.

OTHER PUBLICATIONS

Burney et al., U.S. Appl. No. 11/488,199, filed Jul. 17, 2005.
Dastidar et al., U.S. Appl. No. 12/463,358, filed May 8, 2009.
Fung et al., U.S. Appl. No. 13/149,583, filed May 31, 2011.
Manohararajah et al., U.S. Appl. No. 13/149,562, filed May 31, 2011.

* cited by examiner

Primary Examiner — Thong Q Le
(74) Attorney, Agent, or Firm — Treyz Law Group; Jason Tsai

(57) ABSTRACT

Integrated circuits may include memory interface circuitry operable to communicate with system memory. The memory interface circuitry may receive data and data strobe signals from system memory during read operations. The memory interface circuitry may include de-skew circuitry and dynamic variation compensation circuitry. The de-skew circuitry may be configured during calibration procedures to reduce skew between the data and data strobe signals. The dynamic variation compensation circuitry may be used in real time to compensate for variations in operating conditions. The dynamic variation compensation circuitry may include a phase generation circuit operable to generate data strobe signals having different phases, an edge detection circuit operable to detect leading/trailing edge failures, a control circuit operable to control a counter, and an adjustable delay circuit that is controlled by the counter and that is operable to properly position the data signal with respect to its corresponding data strobe signal.

20 Claims, 11 Drawing Sheets

| lead 1 | lead2 | lag2 | lag1 | UP_DN | EN | Note |
|---|---|---|---|---|---|---|
| 0 | 0 | 0 | 0 | 0 | 0 | STALL }170 |
| 0 | 0 | 0 | 1 | 1 | 1 | UP ⎱ |
| 0 | 0 | 1 | 0 | 1 | 1 | UP ⎬172 |
| 0 | 0 | 1 | 1 | 1 | 1 | UP ⎰ |
| 0 | 1 | 0 | 0 | 0 | 1 | DN }174 |
| 0 | 1 | 0 | 1 | 0 | 1 | DN }178 |
| 0 | 1 | 1 | 0 | 0 | 0 | STALL ⎱170 |
| 0 | 1 | 1 | 1 | 0 | 0 | STALL ⎰ |
| 1 | 0 | 0 | 0 | 0 | 1 | DN }174 |
| 1 | 0 | 0 | 1 | 0 | 0 | STALL }170 |
| 1 | 0 | 1 | 0 | 1 | 1 | UP ⎱176 |
| 1 | 0 | 1 | 1 | 1 | 1 | UP ⎰ |
| 1 | 1 | 0 | 0 | 0 | 1 | DN }174 |
| 1 | 1 | 0 | 1 | 0 | 1 | DN }178 |
| 1 | 1 | 1 | 0 | 0 | 0 | STALL ⎱170 |
| 1 | 1 | 1 | 1 | 0 | 0 | STALL ⎰ |

VARIATION COMPENSATION CIRCUITRY FOR MEMORY INTERFACE

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock), a small amount of skew will result in faulty data transfer during read/write operations. Moreover, variations in the operating condition (i.e., voltage and temperature variations) can further degrade setup and hold times.

SUMMARY

Integrated circuits such as programmable integrated circuits having memory interface circuitry are provided. The memory interface circuitry may be used to communicate with off-chip memory devices (sometimes referred to as memory groups) that are mounted on a circuit board.

The memory devices and the circuit board to which the memory devices are mounted may collectively be referred to as a memory module. Data and data strobe signals may be transmitted between the memory devices and the memory interface circuitry. The memory interface circuitry may provide system-level control signals (e.g., a reference clock signal, address signal, and command signal) to the memory devices.

During read operations, the memory interface circuitry may send appropriate system control signals to the memory module to read data out of the memory devices. The memory devices may output read data and associated data strobe signals. The read data may be latched using capture circuits (sometimes referred to as latches or registers). The read data (DQ) signals may be fed to the capture circuits via a first path, whereas the associated data strobe (DQS) signals may be fed to the capture circuits via a second path.

A de-skew delay circuit may be interposed in the first path between the memory module and the capture circuits. The de-skew delay circuit may be configured during calibration procedures to reduce DQ/DQS skew introduced as a result of process variations (e.g., to reduce DQ/DQS skew caused by differences in board trace lengths, on-chip interconnect paths, packaging characteristics, etc.).

Dynamic variation compensation circuitry may be interposed in the first path between the de-skew delay circuit and the capture circuits and in the second path between the memory module and the capture circuits. The dynamic variation compensation circuitry may be adjusted (or tuned) in real time during normal operation to compensate for potential drift in DQ and/or DQS (e.g., to center the clock edges of the data strobe signal with respect to each data valid window of the data signal) arising as a result of variations in operating conditions such as variations in voltage and temperature.

The dynamic variation compensation circuitry may include a phase generation circuit, an edge detection circuit, a control circuit, a counter, and an adjustable delay circuit. The phase generation circuit is operable to receive the data strobe signal and to generate corresponding data strobe signals of different phases. For example, a center data strobe signal, at least one leading data strobe signal, and at least one lagging data strobe signal may be generated using the phase generation circuit. The center data strobe signal may be a delayed version of the leading data strobe signal, whereas the lagging data strobe signal may be a delayed version of the center data strobe signal. The center data strobe signal may be fed to clock control inputs of the capture circuits.

The edge detection circuitry may receive the at least one leading data strobe signal, the at least one lagging data strobe signal, a delayed data signal via the adjustable delay circuit, and a latched version of the data signal provided at the output of the capture circuit. The edge detection circuit may be configured to determine whether a leading edge failure (e.g., to check if the center data strobe is approaching the left/early edge of a given valid data window) or a trailing edge failure (e.g., to check if the center data strobe is approaching the right/late edge of the given valid data window) is detected by comparing the latched data signal with the delayed data signal at the rising clock edges of the leading and lagging data strobe signals.

The control circuit may direct the counter to count up or to count down depending on the results obtained using the edge detection circuit. As an example, if the counter is incremented, the adjustable delay circuit is configured to introduce more delay to improve hold time. If the counter is decremented, the adjustable delay circuit is configured to introduce less delay to improve setup time. Adjusting the delay of the first path in this way may effectively optimize setup/hold times so that data can be properly latched using the capture circuits even in the presence of variations in operating conditions.

Further features of the present invention, its nature and various advantages will be more apparent from the accompanying drawings and the following detailed description.

BRIEF DESCRIPTION OF THE DRAWINGS

FIG. 10 is a table of illustrative control bit values used for operating the dynamic variation compensation circuitry of FIG. 7 in accordance with an embodiment of the present invention.

DETAILED DESCRIPTION

Embodiments of the present invention relate to integrated circuits containing memory interface circuitry. The memory interface circuitry may be used to interface with off-chip memory such as random-access memory (RAM). The integrated circuits may be digital signal processors, microprocessors, application specific integrated circuits, or other suitable integrated circuits. These types of integrated circuits that are operable to communicate with system memory can benefit from adjustable timing capabilities of the memory interface circuitry.

Figure 1:
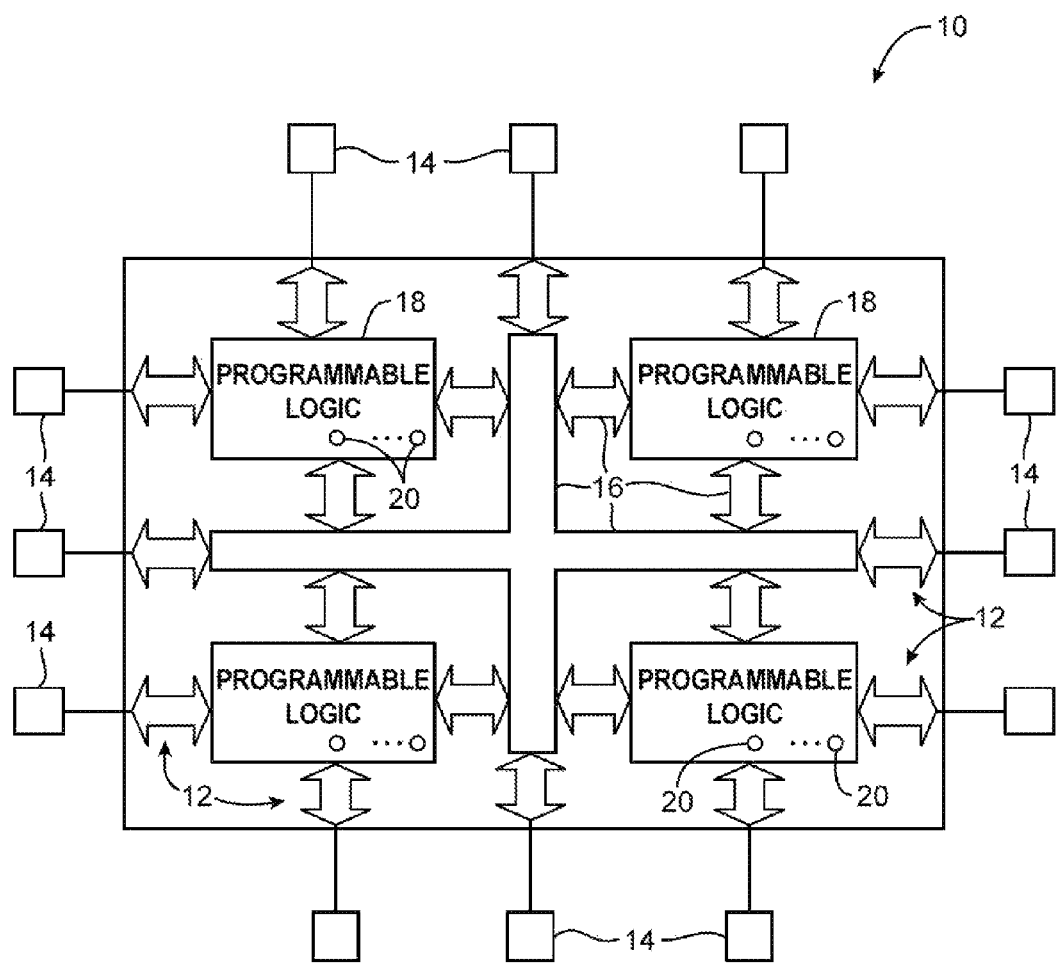
FIG. 1 is a diagram of an illustrative programmable integrated circuit in accordance with an embodiment of the present invention.

As an example, an integrated circuit such as a programmable integrated circuit may include memory interface circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
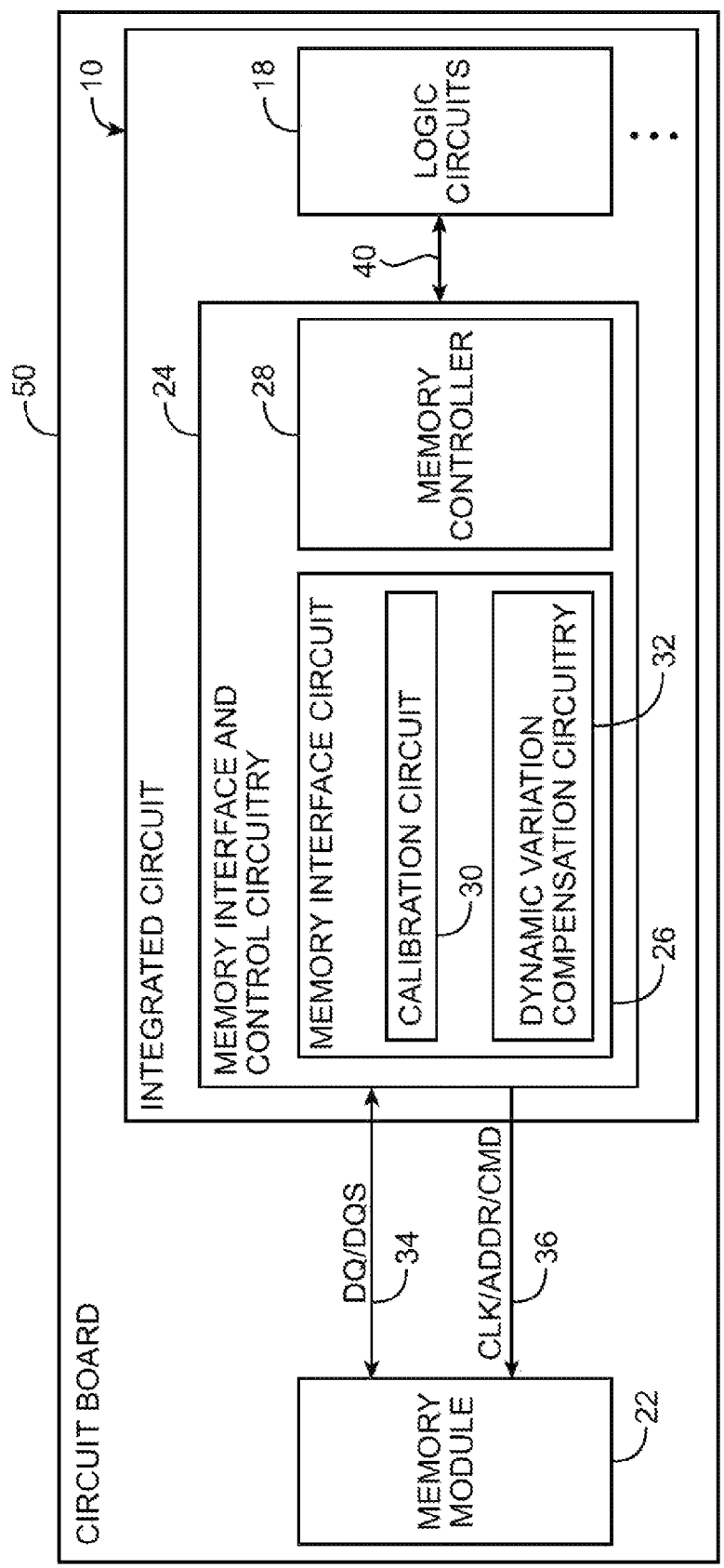
FIG. 2 is a diagram of an illustrative integrated circuit operable to communicate with a memory module in accordance with an embodiment of the present invention.

Device 10 may communicate with off-chip memory such as memory module 22 (see, e.g., FIG. 2). Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, integrated circuit 10, memory module 22, and other circuit components (e.g., integrated circuit chips, surface mount components, etc.) may be mounted on a circuit board 50. Circuit board 50 may, for example, be a rigid printed circuit board (PCB), a flexible circuit board (sometimes referred to as a flex circuit), a rigid flex circuit, or other suitable types of substrates. Board components may be interconnected through conductive traces and packaging (e.g., sockets into which integrated circuits are mounted) formed on board 50.

Device 10 may include memory interface circuitry 24 (sometimes referred to as memory interface and control circuitry) that serves to relay information between memory module 22 and logic circuits 18 that are internal to device 10. Memory interface circuitry 24 may include memory interface circuit 26 and memory controller 28. Read/write data may be conveyed between memory interface circuitry 24 and programmable circuitry 18 via path 40. Memory controller 28 may be configured to generate appropriate control signals corresponding to the memory protocol currently under use (e.g., circuit 28 may handle memory data management to address desired banks, rows, and columns and to perform memory refresh). Memory controller 28 may also serve to periodically request recalibration of memory interface circuit 26.

Memory interface circuit 26 may include memory interface calibration circuitry 30, dynamic variation compensation circuitry 32, memory access request sequencer (e.g., a sequencing circuit operable to determine the order in which received memory access requests are to be serviced), and other circuitry operable to perform desired data rate conversions and operable to generate signals that meet timing requirements specified by the memory protocol currently under use.

Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS may be conveyed from memory interface circuit 26 to memory module 22 over path 34. Calibration circuitry 30 may be used upon startup to reduce skew caused by process variations, whereas dynamic variation compensation circuitry 32 may be used during normal operation to compensate for variations in operating conditions (e.g., variations in operating voltage and temperature).

During read and write operations, control signals such as clock CLK, address ADDR, and command CMD signals may be conveyed from memory controller 28 to memory module 22 over path 36. Signal CLK may serve as a system reference clock (e.g., a reference clock to which the DQS signals, address signal ADDR, and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

The arrangement of FIG. 2 is merely illustrative and is not intended to limit the scope of the present invention. Integrated circuits other than programmable integrated circuits may similarly include memory interface circuitry 24 that is used to communicate with one or more memory modules 22.

Figure 3:
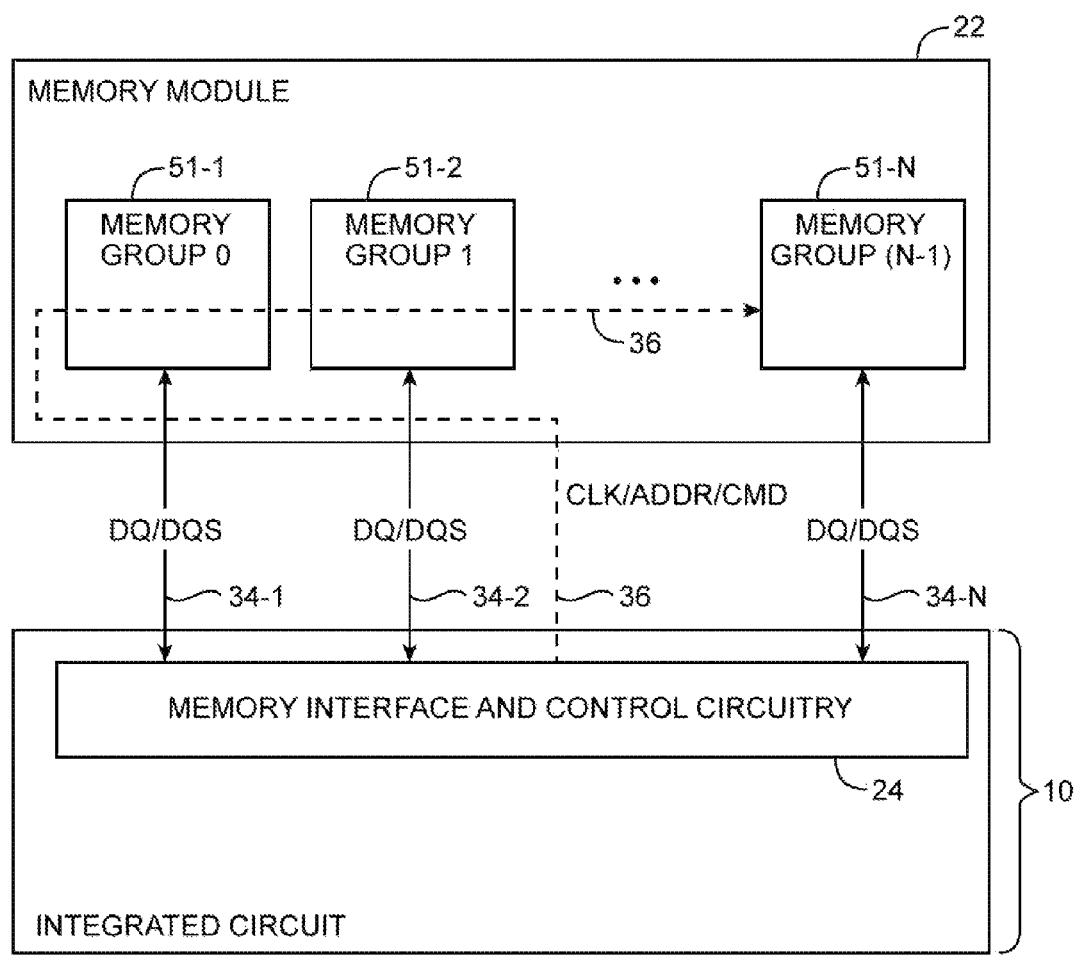
FIG. 3 is a diagram of an illustrative memory module that contains multiple memory groups in accordance with an embodiment of the present invention.

Memory module 22 may include a series of memory devices, each of which is sometimes referred to as a memory group (as shown in FIG. 3). For example, memory module 22 may include first memory group 51-1, second memory group 51-2, . . . , and $N^{th}$ memory group 51-N. Memory module 22 may include nine memory groups (as an example). Each of the memory groups may contain hundreds or thousands of memory cells (e.g., RAM cells). The memory groups may communicate with memory interface circuitry 24 through respective signal paths. For example, first memory group 51-1 may communicate with circuitry 24 by sending data and data strobe signals (i.e., DQ and DQS) over path 34-1, second memory group 51-2 may communicate circuitry 24 by sending DQ/DQS over path 34-2, etc.

In general, memory access operations are not synchronized with system-level control signals CLK/CMD/ADDR. As a result, the DQ signals that are received from memory module 22 are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22.

Process, voltage, and temperature (PVT) variations may introduce skew between the DQ and DQS signals, resulting in degraded data sampling margins (i.e., reduced setup and hold times).

The operation of each memory group is somewhat independent, so memory module 22 generates a separate DQS signal for each of the memory groups. Memory interface circuitry 24 may send control signals to the memory groups via path 36. Memory module 22 of FIG. 3 may be a type of memory module in which the control signals on path 36 arrive at each of the memory groups at different times. For example, because of the way path 36 is routed, the control signals on path 36 may arrive first at memory group 51-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 51-1 may output read data before subsequent memory group 51-2, memory group 51-2 may output read data before subsequent memory group 51-3, memory group 51-3 may output read data before subsequent memory group 51-4, etc. Memory interface circuitry 24 may therefore receive read data from the different memory groups at staggered times.

Figure 4:
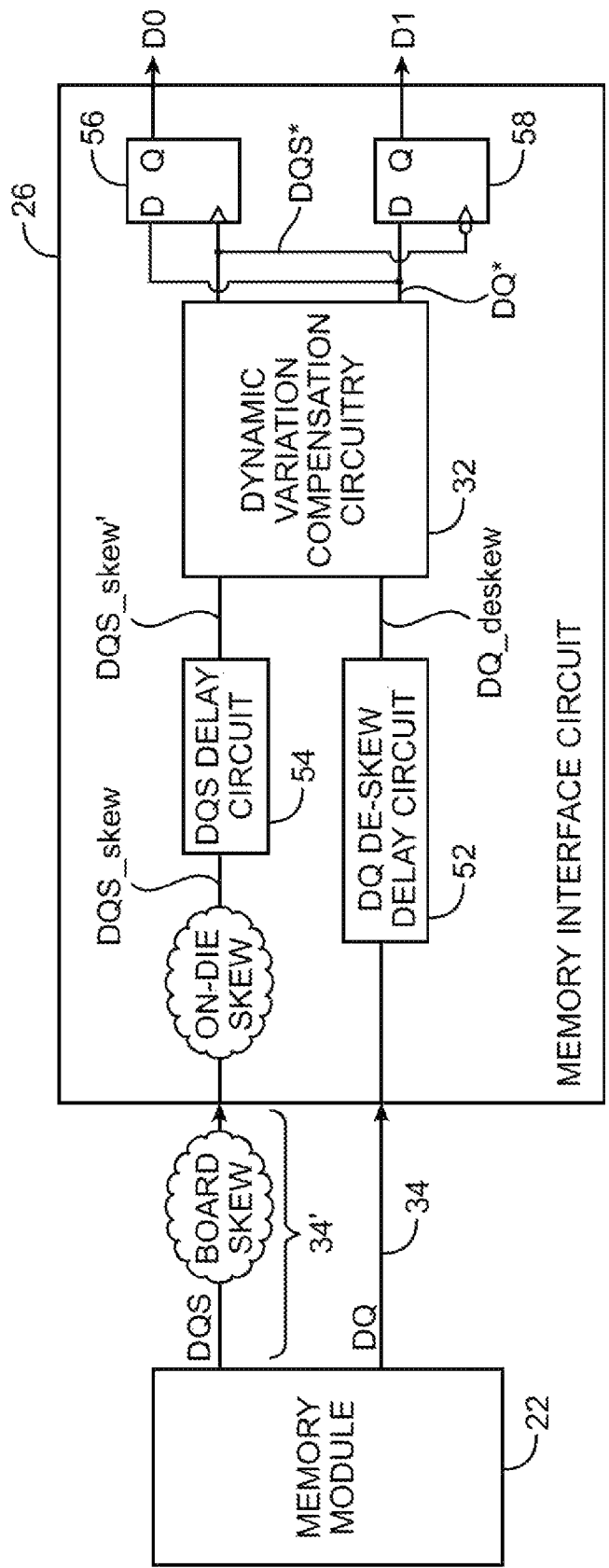
FIG. 4 is a diagram of an illustrative memory interface circuit that includes dynamic variation compensation circuitry in accordance with an embodiment of the present invention.

FIG. 4 is a diagram illustrating read signal flow associated with one memory group. For clarity, data flow and circuitry associated with the other memory groups are omitted. As shown in FIG. 4, memory interface circuit 26 may include a positive-edge-triggered latch 56 and a negative-edge-triggered latch 58 that are used to capture data signals read out from the one memory group. Latches 56 and 58 are sometimes referred to as DQ flip-flops or registers. In an ideal scenario, the data and data strobe signals arriving at memory interface circuit 26 have rising clock edges that are perfectly aligned. Memory interface circuit 26 may include a DQS delay circuit 54 configured to delay the data strobe signal by a quarter clock cycle so that the rising edges of the data strobe signal clocks at the center of each data window (i.e., so that setup and hold times are equal).

In practice, however, data signal DQ conveyed over path 34 and data strobe signal DQS conveyed over path 34' from memory module 22 to memory interface circuit 26 may suffer from DQ/DQS skew (i.e., DQ and DQS arriving at memory interface circuit 26 may have rising clock edges that are potentially offset with respect to each another). For example, differences in the lengths of board traces, on-die metal routing lines, and packaging material characteristics associated with paths 34 and 34' may result in board skew and on-die skew. Board skew and on-die skew may cause the data strobe signal to be undesirably skewed with respect to the data signal (e.g., signal DQS_skew may be skewed with respect to DQ). As a result, the rising/falling edge of delayed data strobe signal DQS_skew' may not be positioned at the center of a corresponding data window, thereby reducing setup and hold times.

To compensate for such types of skew, memory interface circuit 26 may include DQ de-skew delay circuit 52 configured to offset the delay of the data path to help DQS rising/falling clock edges to be positioned at the center of each data window. For example, de-skew delay circuit 52 may receive signal DQ at its input and may generate signal DQ_deskew at its output (e.g., signal DQ_deskew may be a delayed version of DQ). Signal DQ_deskew may be delayed using delay circuit 52 such that signals DQ_deskew and DQS_skew' are positioned properly with respect to each other (i.e., such that setup and hold times are optimized). De-skew delay circuit 52 may be formed as part of calibration circuit 30 (FIG. 2) and may be configured with a delay setting determined during calibration procedures. These calibration procedures may be performed once upon device startup or may be performed on a periodic basis by interrupting system operations.

Figure 5:
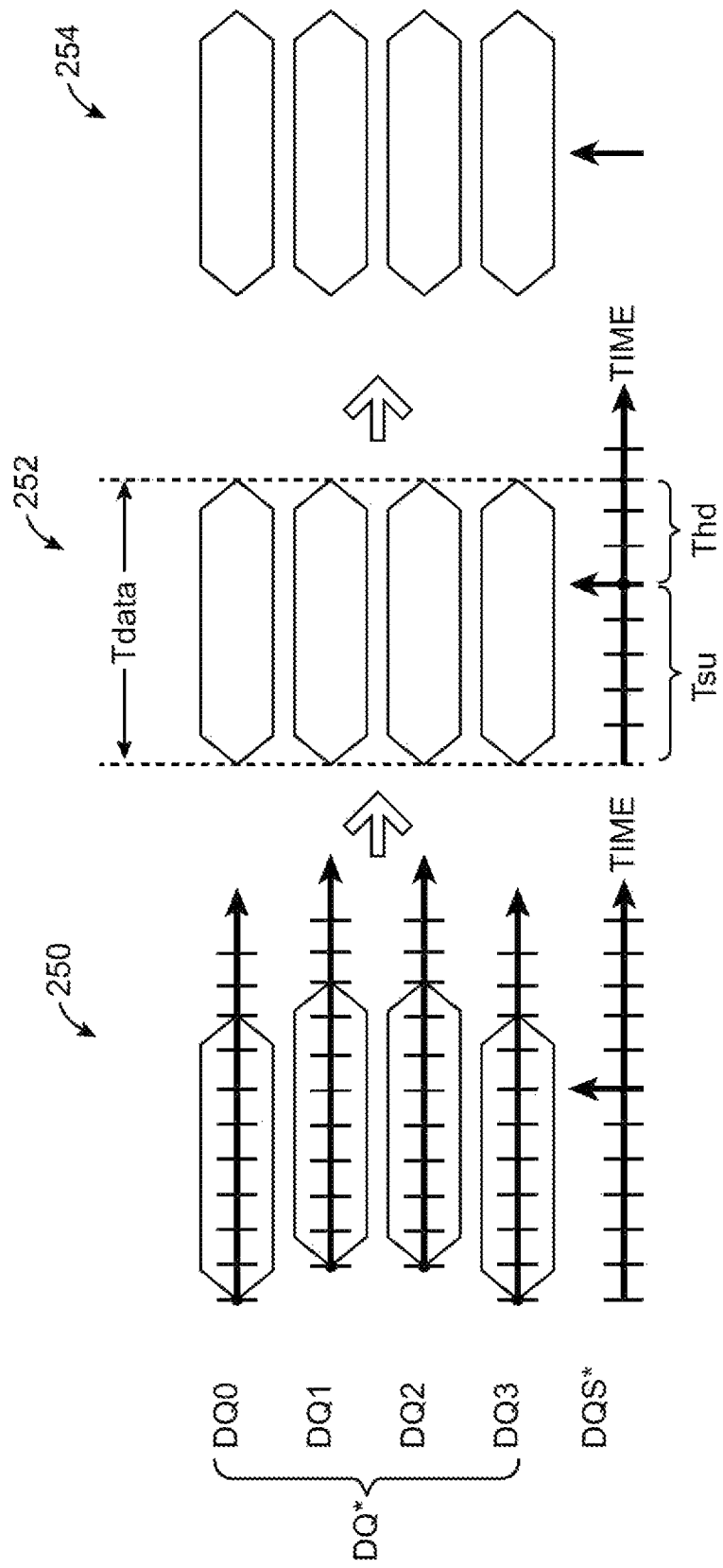
FIG. 5 is a diagram showing illustrative steps involved in performing data de-skew calibration in accordance with an embodiment of the present invention.

During memory interface calibration processes, memory interface circuit 26 may be controlled using memory interface calibration circuit 30. FIG. 5 is a diagram showing illustrative steps involved in performing data de-skew (sometimes referred to as read DQ/DQS centering). Read DQ/DQS centering may serve to place the rising and falling edges of DQS_skew' at the center of each valid DQ window (i.e., to maximize DQ and DQS setup and hold margins).

Diagram 250 shows a first snapshot in time before DQ/DQS centering has been performed. As shown in diagram 250, signals DQ* associated with different memory groups may be offset in time with respect to one another (e.g., DQ0 from the first memory group and DQ1 from the second memory group are offset by one delay step). In this example DQ0 and DQ3 arrive one delay step earlier than DQ1 and DQ2. Signal DQS* is also not placed at the center of each DQ window.

Diagram 252 shows a second snapshot in time after the data signals have been equalized. For example, DQ0 and DQ3 may be delayed by one delay step so that DQ0-DQ4 are aligned to a common read data valid window Tdata. During a first time period, the data signals may be collectively delayed to determine the DQ range (e.g., to measure a setup time Tsu). During a second time period, DQS* may be delayed to determine the DQS range (e.g., to measure a hold time Thd). In the example of FIG. 5, the measured Tsu is equal to five delay steps, whereas the measure Thd is equal to three delay steps. Signal DQS* may be shifted back to its original position (i.e., its position in diagram 250) after determining Thd.

Diagram 254 shows a third snapshot in time after DQ/DQS centering has been performed. In this example, each of signals DQ0-DQ3 have been delayed by one additional delay step using DQ de-skew delay circuit 52 associated with each memory group so that Tsu and Thd are equal (e.g., so that DQS* is centered within Tdata).

During normal operation of device 10, the performance of the memory interface circuitry may be affected by variations in operations conditions such as variations in operating voltage, operating temperature, etc. Variations in voltage and temperature (i.e., VT variations) may cause calibrated (de-skewed) signal DQ_deskew to drift as operating conditions change (e.g., as temperature rises and falls, as power supply voltage increases and decreases, etc.).

Figure 6:
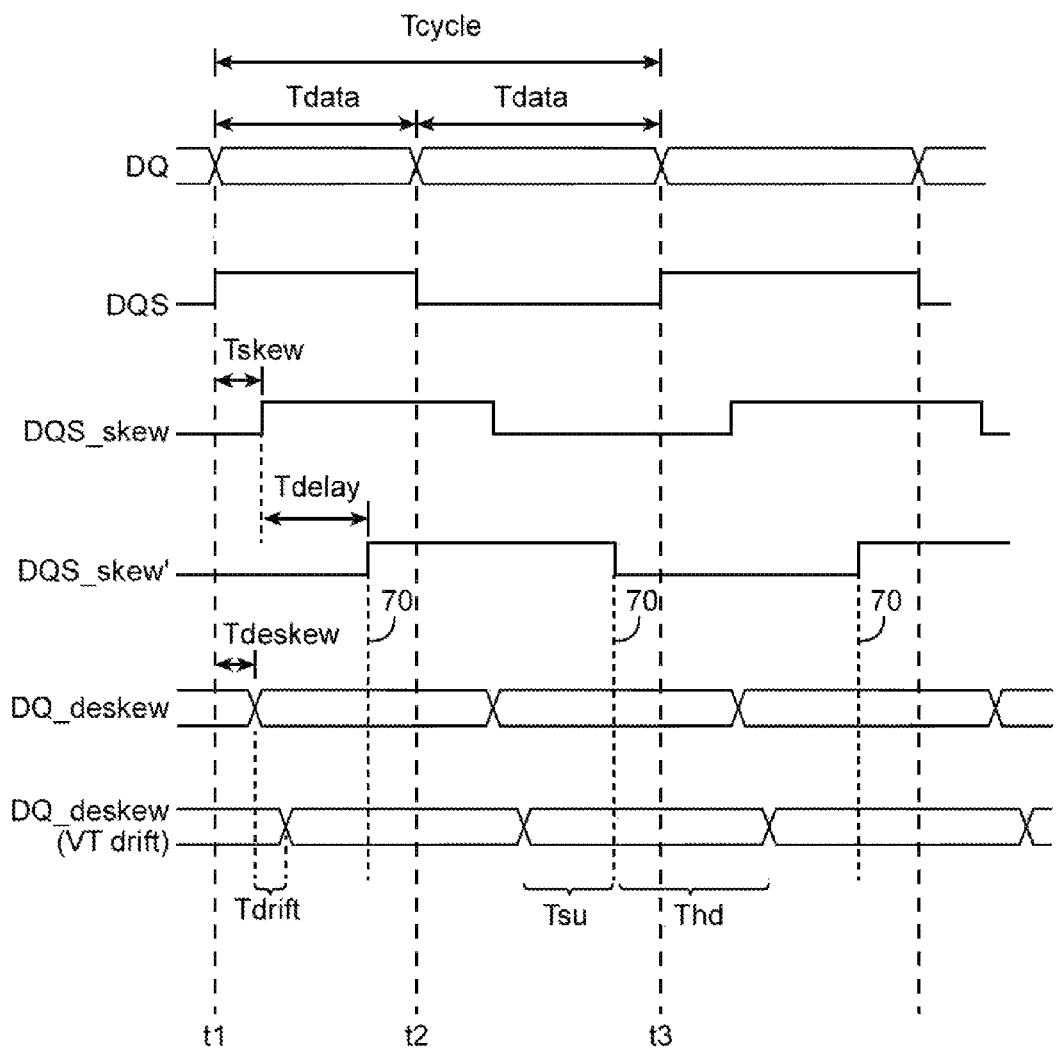
FIG. 6 is a timing diagram showing how variation can affect memory operation in accordance with an embodiment of the present invention.

FIG. 6 is a timing diagram showing how VT variations may affect calibrated data and data strobe signals. As shown in FIG. 6, signals DQ and DQS may synchronously arrive at memory interface circuit 26 via paths 34 and 34', respectively. For example, DQ may toggle values at time t1, t2, and t3, whereas DQS may clock high, low, and high at time t1, t2, and t3, respectively. The data valid window Tdata may be equal to a half DQS cycle Tcycle.

Board skew, on-die skew, process variation, and other sources of skew may cause DQS_skew to be delayed by Tskew relative to DQ (as an example). Signal DQS_skew may be delayed by a quarter clock cycle (i.e., Tdelay is equal to Tcycle/4) using delay circuit 54 to produce DQS_skew'. Calibration procedures of the type described in connection with FIG. 5 may be used to calibrate memory interface circuit 26 so that signal DQ_deskew generated by delay circuit 52 is properly positioned with respect to clock edges 70 of DQS_skew' (e.g., so that clock edges of DQS_skew' are centered to data valid windows of DQ_deskew).

In the presence of variations in operating conditions, signal DQ_deskew that has previously been calibrated may suffer from undesired drift (e.g., DQ_deskew may be shifted from its optimal position by Tdrift), thereby degrading data latching margins. In this example, setup time Tsu is degraded. In other scenarios, hold time Thd may be degraded.

Dynamic variation compensation circuitry 32 may be used to compensate for such types of variations for achieving optimal read latching margins. As shown in FIG. 4, dynamic variation compensation circuitry 32 in memory interface circuit 26 may have a first input that receives signal DQ_deskew, a second input that receives delayed signal DQS_skew', a first output on which corrected data signal DQ* is provided, and a second output on which corrected data strobe signal DQS* is provided. Signal DQ* may be a delayed version of DQ_deskew, whereas signal DQS* may be a delayed version of DQS_skew'. Latches 56 and 58 may each have a data input configured to receive DQ* and a clock control input configured to receive DQS* (e.g., the positive clock control input of latch 56 and the negative clock control input of latch 58 may each receive signal DQS*). Latch 56 may have a data output on which captured data signal D0 is provided, whereas latch 58 may have a data output on which captured data signal D1 is provided. Data signals D0 and D1 may represent data latched on the rising and falling clock edges of DQS*, respectively. Latching circuits 56 and 58 that are used to capture and output data in this arrangement may sometimes be referred to collectively as a double-data-rate to full-data-rate capture circuit.

Figure 7:
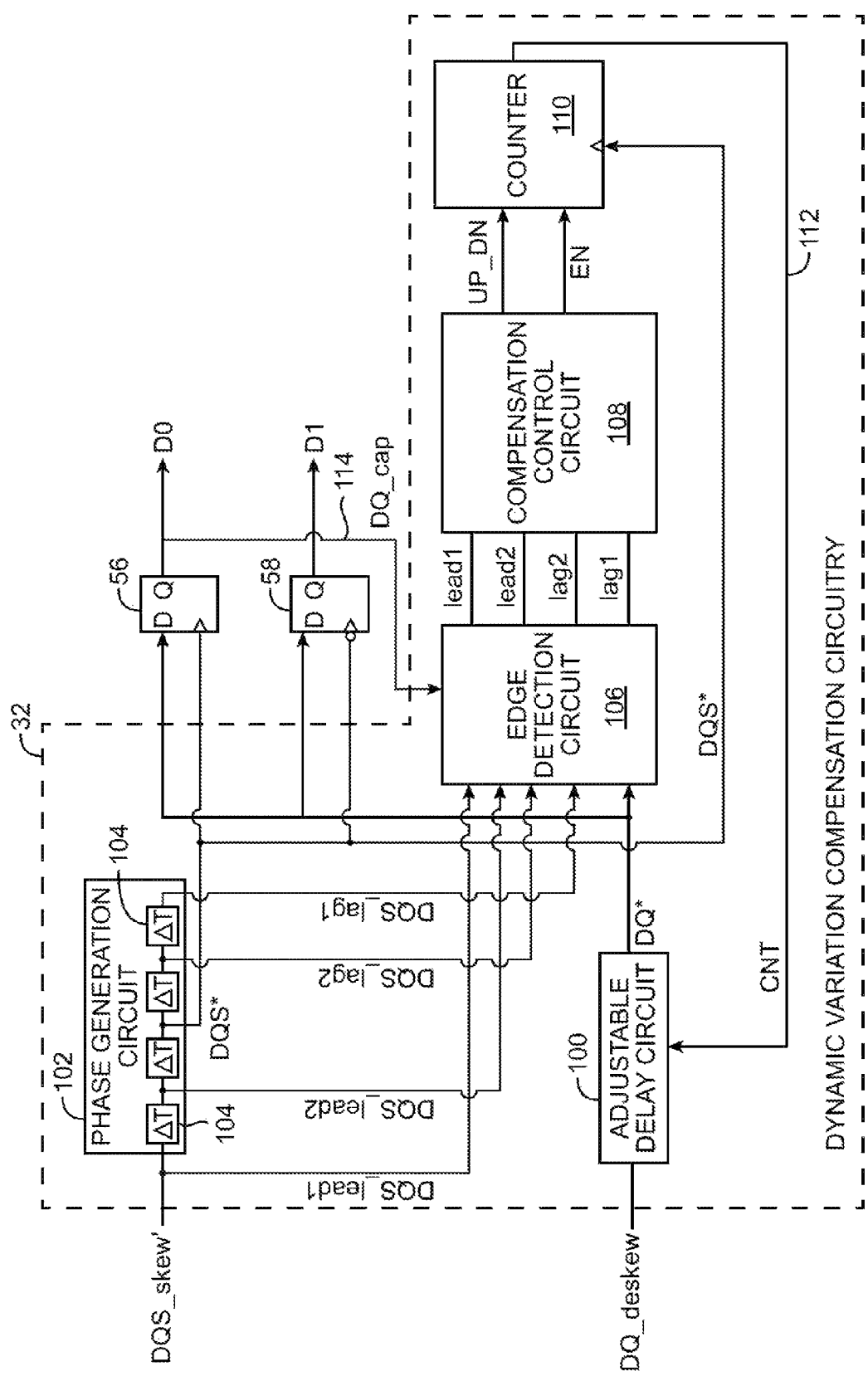
FIG. 7 is a circuit diagram of illustrative dynamic variation compensation circuitry in accordance with an embodiment of the present invention.

FIG. 7 shows one possible implementation of dynamic variation compensation circuitry 32. Compensation circuitry 32 may be dynamically adjusted in real time to compensate for voltage/temperature drift. As shown in FIG. 7, variation compensation circuitry 32 may include at least a delay circuit such as adjustable delay circuit 100, a delay chain such as phase generation circuit 102, a monitoring circuit such as edge detection circuit 106, a control circuit such as compensation control circuit 108, and a counting circuit such as counter 110.

Adjustable delay circuit 100 may have an input operable to receive signal DQ_deskew from de-skew delay circuit 52, an output on which signal DQ* is provided, and a control input operable to receive control signal CNT from counter 110 via path 112. Signal DQ* may be fed to the data inputs of latches 56 and 58. Signal DQ* may be a delayed version of signal DQ_deskew. If the value of CNT is decreased, the delay introduced by adjustable delay circuit 100 may be reduced (as an example). If the value of CNT is increased, the delay introduced by adjustable delay circuit 100 may be increased.

Phase generation circuit 102 may have an input that receives DQS_skew' from DQS delay circuit 54. Phase generation circuit 102 may have four phase delay circuits 104, each of which has an output and each of which is operable to provide delay ΔT that is less than a quarter clock cycle (as an example). If desired, delay ΔT may be any suitable fraction of valid data window Tdata.

The four delay circuits 104 may be coupled in a chain. Signal DQS* may be provided at the output of the second delay circuit 104 in the chain (e.g., at the midpoint of the chain). Signal DQS_lag2 may be provided at the output of the third delay circuit 104 in the chain. Signal DQS_lag1 may be provided at the output of the fourth delay circuit 104 in the chain. Signal DQS_lag2 may be a delayed version of DQS*, whereas signal DQS_lag1 may be a delayed version of DQS_lag2. Similarly, signal DQS_lead2 may be provided at the output of first delay circuit 104 in the chain, and signal DQS_lead1 may be provided at the input of first delay circuit 104. Signal DQS_lead1 may be identical to DQS_skew'. Signal DQS* may be a delayed version of DQS_lead2, whereas signal DQS_lead2 may be a delayed version of DQS_lead1. Signal DQS* may be fed to clock control inputs of latches 56 and 58 and counter 110.

Figure 8:
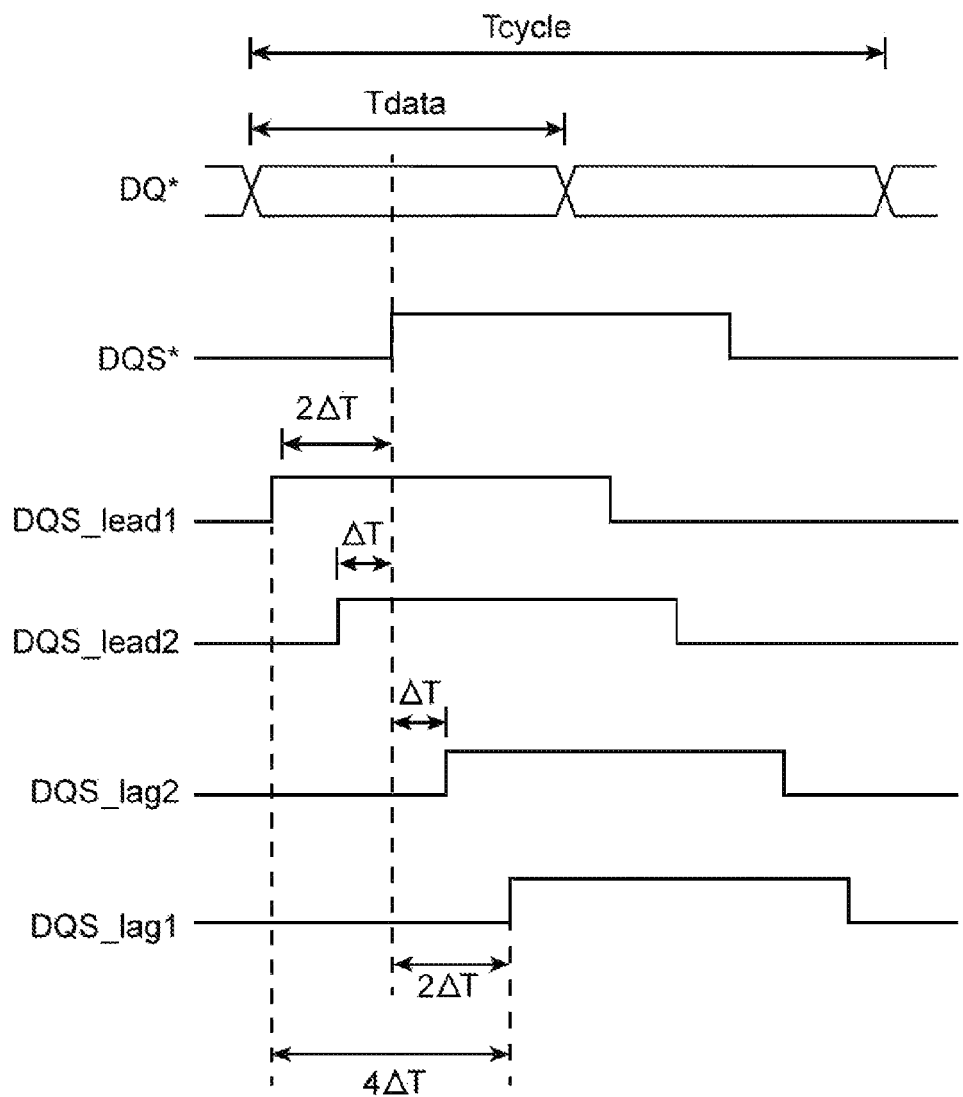
FIG. 8 is a timing diagram showing leading and lagging clock signals generated using the variation compensation circuitry of FIG. 6 in accordance with an embodiment of the present invention.

The timing relationship of signals DQS_lead1, DQS_lead2, DQS_lag2, and DQS_lag1 is shown in FIG. 8. As shown in FIG. 8, DQS* rising clock edge may be centered within data valid window Tdata during read operations. Signal DQS_lead1 may rise $2\Delta T$ earlier than DQS*, whereas signal DQS_lead2 may rise $\Delta T$ earlier than DQS*. Signal DQS_lag2 may rise $\Delta T$ later than DQS*, whereas signal DQS_lag1 may rise $2\Delta T$ later than DQS*. Time period $\Delta T$ may be equal to a 1/8 clock cycle, may be less than a 1/8 clock cycles, or may be any suitable fraction of Tcycle. In the example of FIG. 7 in which phase generation circuit 104 includes four delay circuits 104, it may be desirable that $4\Delta T$ be set to slightly less than a half clock cycle Tcycle.

Edge detection circuit 106 may have inputs configured to receive signal DQ*, captured signal DQ_cap (i.e., output data latched by positive-edge-triggered latch 56) via path 114, and signals DQS_lead1, DQS_lead2, DQS_lag2, and DQS_lag1 from phase generation circuit 102 (see, e.g., FIG. 7). Edge detection circuit 106 may be configured to output signals lead1, lead2, lag2 and lag1. Edge detection circuit 106 may be configured to detect leading edge failures or trailing edge failures (e.g., to detect whether DQS* is shifting towards the leading/early edge of the data valid window or towards the trailing/late edge of the data valid window).

Edge detection circuit 106 may drive lead1 low if DQ* is equal to DQ_cap at a rising clock edge of DQS_lead1 or may drive lead1 high if DQ* and DQ_cap are different at the rising clock edge of DQS_lead1. Circuit 106 may drive lead2 low if DQ* is equal to DQ_cap at a rising clock edge of DQS_lead2 or may drive lead2 high if DQ* and DQ_cap are different at the rising clock edge of DQS_lead2. Circuit 106 may drive lag2 low if DQ* is equal to DQ_cap at a rising clock edge of DQS_lag2 or may drive lag2 high if DQ* and DQ_cap are different at the rising clock edge of DQS_lag2. Circuit 106 may drive lag1 low if DQ* is equal to DQ_cap at a rising clock edge of DQS_lag1 or may drive lag1 high if DQ* and DQ_cap are different at the rising clock edge of DQS_lag1. Circuit 106 used in this way may therefore be capable of detecting when Tsu is less than $2\Delta T$ by monitoring the value of lead1, when Tsu is less than $\Delta T$ by monitoring the value of lead2, when Thd is less $\Delta T$ by monitoring the value of lag2, or when Thd is less than $2\Delta T$ by monitoring the value of lag1.

Compensation control circuit 108 may receive signals lead1, lead2, lag2, and lag1 from edge detection circuit 106. Control circuit 108 may output control signals such as up/down control signal UP_DN and enable signal EN to counter 110. Based on the values of lead1, lead2, lag2, and lag1, control circuit 108 may direct counter 110 to count up by driving signal UP_DN high or to count down by driving signal UP_DN low. Counter 110 may only be permitted to change its current value if enable signal EN is high. When signal EN is low, the value of counter 110 stays constant.

The dynamic variation compensation circuitry of FIG. 7 is merely illustrative and does not serve to limit the scope of the present invention. If desired, phase generation circuit may include only two delay circuits 104 so that only one leading signal and one lagging signal are generated, may include six delay circuits 104 so that three leading signals and three lagging signals are generated, and may include other control circuitry for monitoring DQ/DQS skew.

Figure 9:
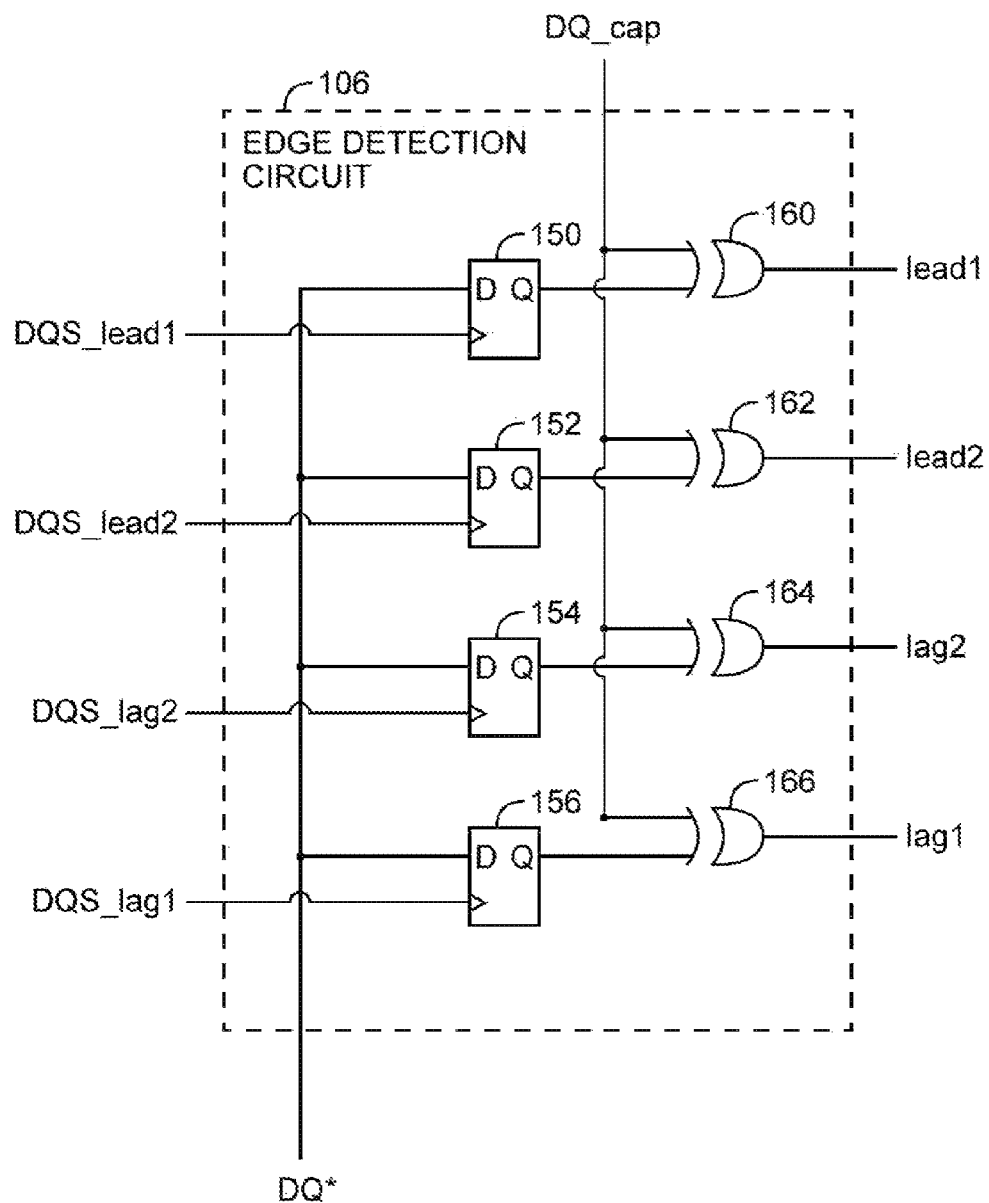
FIG. 9 is a circuit diagram of an illustrative edge detection circuit in accordance with an embodiment of the present invention.

FIG. 9 shows one possible implementation of edge detection circuit 106 of the type described in connection with FIG. 7. As shown in FIG. 9, circuit 106 may include four positive-edge-triggered latch 150, 152, 154, and 156 and four logic exclusive-OR logic gates 160, 162, 164, and 166. Each of the four latches may have a data input configured to receive signal DQ* from adjustable delay circuit 100. Latch 150 may have a clock control input configured to receive signal DQS_lead1 and an output that is coupled to a first input of logic gate 160. Latch 152 may have a clock control input configured to receive signal DQS_lead2 and an output that is coupled to a first input of logic gate 162. Latch 154 may have a clock control input configured to receive signal DQS_lag2 and an output that is coupled to a first input of logic gate 164. Latch 156 may have a clock control input configured to receive signal DQS_lag1 and an output that is coupled to a first input of logic gate 166. Logic gates 160, 162, 164, and 166 may each have a second input configured to receive signal DQ_cap from latch 56. Gate 160 may have an output at which signal lead1 is provide. Gate 162 may have an output at which signal lead2 is provide. Gate 164 may have an output at which signal lag2 is provided. Gate 166 may have an output at which signal lag1 is provided.

In another suitable implementation of circuit 106, each of latches 150, 152, 154, 156 may be a negative-edge-triggered latch and signal DQ_cap may be routed from the output of latch 58. Edge detection circuit 106 may include any suitable number of latches and logic gates to accommodate any desired number of leading/lagging signals. If desired, other ways of forming an edge detection circuit operable to detect edges of data valid window Tdata may be used.

Control circuit 108 may be a combinational logic circuit configured to generate control signals based on the truth table of FIG. 10. When control circuit 108 receives input values corresponding to rows 170 in table 171, enable signal may remain low to place counter 110 in stall mode (e.g., to disable counter 110 so that the value of counter 110 cannot change).

Input values corresponding to rows 172 in table 171 are indicative of trailing edge failures (because only signals lag1 and/or lag2 are high). As a result, signal UP_DN and EN may be driven high to increment counter 110 to introduce additional delay in the data path to increase hold time. Input values corresponding to rows 174 in table 171 are indicative of leading edge failures (because only signals lead1 and/or lead2 are high). As a result, signal UP_DN and EN may be respectively driven low and high to decrement counter 110 to reduce delay in the data path to increase setup time.

Input values corresponding to rows 176 in table 171 are indicative of leading and trailing edge failures, where hold time is more severely degraded than setup time (because lag2 is high and lead2 is low). As a result, signal UP_DN and EN may be driven high to increment counter 110 to introduce additional delay in the data path to increase hold time. Input values corresponding to rows 178 in table 171 are indicative of leading and trailing edge failures, where setup time is more severely degraded than hold time (because lag2 is low and lead2 is high). As a result, signal UP_DN and EN may be driven low and high, respectively, to decrement counter 110 to reduce delay in the data path for increasing setup time.

In general, signals lead1 and lag1 are used to provide early detection of VT drift in DQ/DQS, because DQS_lead1 and DQS_lag1 clock relatively close to the edges of Tdata. In contrast, signals lead2 and lag2 are used to provide improved detection resolution capability in scenarios where both leading and trailing edges are detected (e.g., to determine which one of the hold time and setup time is more severely degraded). More than two or less than two leading/lagging signals may be used, if desired.

Figure 11:
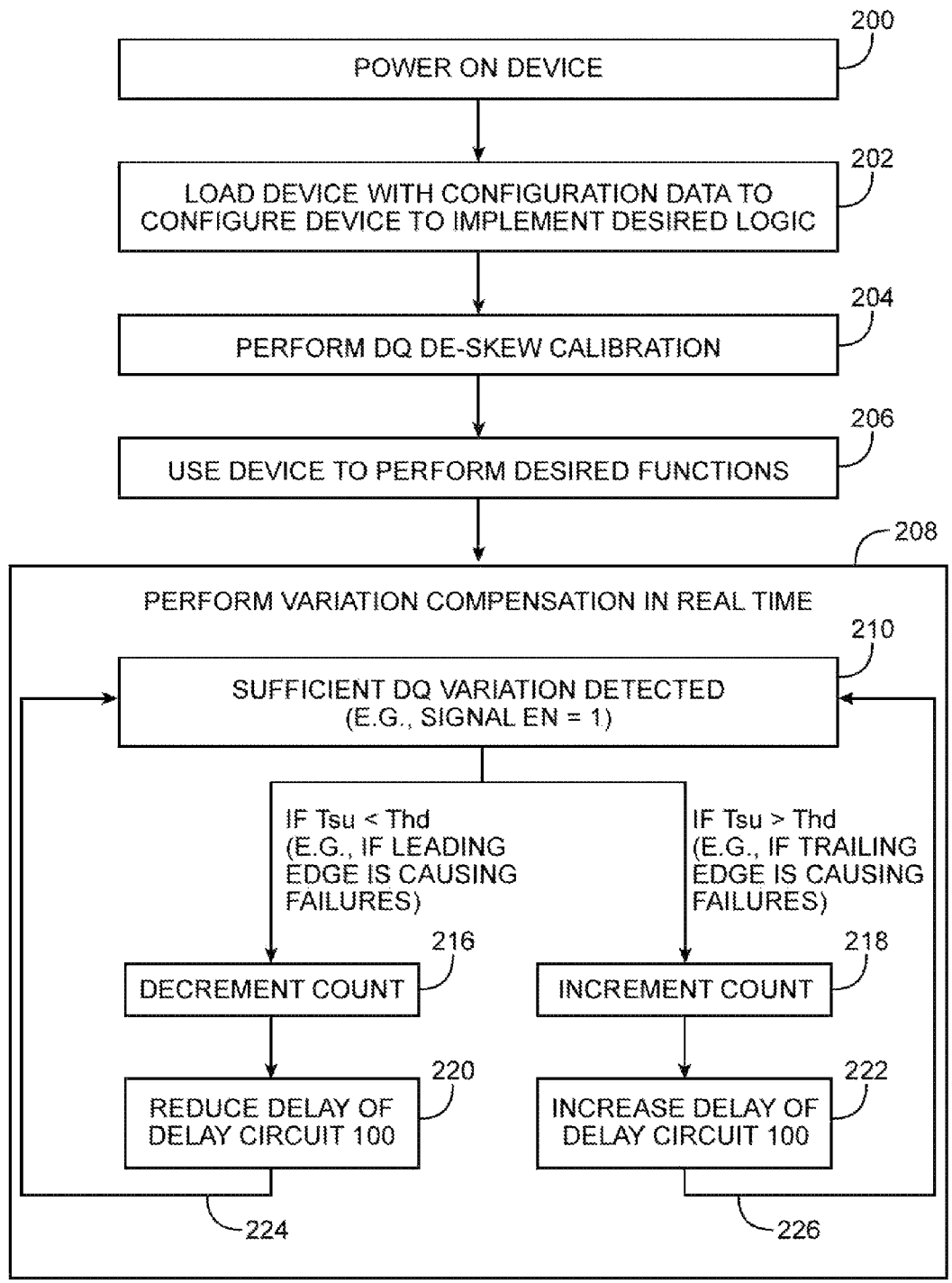
FIG. 11 is a flow chart of illustrative steps involved in operating the dynamic variation compensation circuitry of the type shown in connection with FIG. 7 in accordance with an embodiment of the present invention.

FIG. 11 shows illustrative steps involved in operating the memory interface circuit of the type described in connection with FIG. 4. At step 200, device 10 may be powered up. At step 202, device 10 may be loaded with configuration data to implement custom logic functions (if device 10 is a programmable integrated circuit). Step 202 need not be performed for other types of integrated circuits such as application specific integrated circuits, application specific standard products, etc.

At step 204, DQ de-skew calibration may be performed (e.g., read DQ/DQS centering may be performed by adjusting DQ de-skew delay circuit using steps described in connection with FIG. 5). At step 206, device 10 may be placed in normal operation to perform desired functions.

During normal operation, variation compensation may be performed in real time using dynamic variation compensation circuitry 32 to compensate for VT variations and/or other sources of variations in operating condition (step 208). At step 210, control circuit 108 may be used to detect for the presence of sufficient DQ drift (e.g., to check whether enable signal EN is driven high). If sufficient DQ variation is detected and if setup time Tsu is less than hold time Thd (i.e., if leading edge failure is more critical), processing may proceed to step 216. If sufficient DQ variation is detected and if Tsu is greater than Thd (i.e., if trailing edge failure is more critical), processing may proceed to step 218.

At step 216, the value of counter 110 may be decremented (e.g., by deasserting signal UP_DN). Configuring counter 110 to count down in this way may cause delay circuit 100 to reduce the amount of delay in the DQ path so that setup time Tsu will be increased. Processing may then loop back to step 210 to continue monitoring for DQ drift, as indicated by path 224.

At step 218, the value of counter 110 may be incremented (e.g., by asserting signal UP_DN). Configuring counter 110 to count up in this way may cause delay circuit 100 to increase the amount of delay in the DQ path so that hold time Thd will be increased. Processing may then loop back to step 210 to continue monitoring for DQ drift, as indicated by path 226.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   circuitry operable to receive a data signal and a data strobe signal, to generate a first delayed signal that is delayed by an amount with respect to the data signal, and to generate a second delayed signal that is delayed with respect to the data strobe signal, wherein the first delayed signal is delayed by an adjustable amount in real time to compensate for variations in operating conditions so that timing margins associated with latching the data signal using the data strobe signal are optimized; and
   a latching circuit operable to latch the first delayed signal using the second delayed signal.

2. The integrated circuit defined in claim 1 wherein the integrated circuit comprises a device operable to communicate with system memory.

3. The integrated circuit defined in claim 1 wherein the latching circuit comprises an edge-triggered latch.

4. The integrated circuit defined in claim 1 further comprising:
   a delay circuit through which the data strobe signal is passed to the circuitry, wherein the delay circuit is configured to provide a predetermined amount of delay.

5. The integrated circuit defined in claim 1 wherein the data strobe signal clocks high once per clock cycle, the integrated circuit further comprising:
   a delay circuit through which the data strobe signal is passed to the circuitry, wherein the delay circuit is configured to provide a quarter clock cycle delay.

6. The integrated circuit defined in claim 1 further comprising:
   a delay circuit through which the data signal is passed to the circuitry, wherein the delay circuit is configured to provide additional delay determined during calibration operations for reducing skew between the data signal and the data strobe signal.

7. The integrated circuit defined in claim 4 further comprising:
   a delay circuit through which the data signal is passed to the circuitry, wherein the delay circuit is configured to provide additional delay determined during calibration operations for reducing skew between the data signal and the data strobe signal.

8. The integrated circuit defined in claim 1 wherein the circuitry comprises:
   a phase generation circuit operable to generate different versions of the data strobe signal;
   an edge detection circuit operable to receive the different versions of the data strobe signal and to generate data bits reflective of whether the data signal and the data strobe signal are suffering from degraded timing margins;
   a control circuit operable to receive the data bits and operable to generate corresponding control signals; and
   an adjustable delay circuit operable to provide an amount of delay based on the control signals generated by the control circuit.

9. An integrated circuit comprising:
   a monitoring circuit having a first input operable to receive a first data signal that is valid within a window defined by a leading edge and a trailing edge, a second input operable to receive a second data signal, and third inputs operable to receive at least first and second data strobe signals, wherein the second data strobe signal is a delayed version of the first data strobe signal and wherein the monitoring circuit is operable to check whether at least one of the first and second data strobe signals toggles within the window.

10. The integrated circuit defined in claim 9 further comprising:
    a latching circuit operable to provide the first data signal at its output.

11. The integrated circuit defined in claim 9 further comprising:
    an adjustable delay circuit operable to provide the second data signal at its output.

12. The integrated circuit defined in claim 9 further comprising:
    a delay chain operable to generate the at least first and second data strobe signals.

13. The integrated circuit defined in claim 12 further comprising:
    a latching circuit having a control input operable to receive a selected one of the first and second data strobe signals from the delay chain.

14. The integrated circuit defined in claim 9 further comprising:
an adjustable delay circuit operable to provide a delay and operable to provide the second data signal at its output; and
a control circuit coupled to the monitoring circuit, wherein the control circuit is operable to dynamically tune the delay of the adjustable delay circuit in response to detecting that at least one of the first and second data strobe signals fails to toggle within the window.

15. The integrated circuit defined in claim 14 further comprising:
a counter coupled between the adjustable delay circuit and the control circuit, wherein the counter has an input operable to receive a selected one of the first and second data strobe signals and an output over which a count signal that sets the delay of the adjustable delay circuit is provided.

16. A method comprising:
with an adjustable delay circuit, delaying a data signal;
with a delay chain, generating different delayed versions of a data strobe signal; and
with a latching circuit, latching the delayed data signal using a selected one of the different delayed versions of the data strobe signal.

17. The method defined in claim 16 further comprising:
with a control circuit coupled to the adjustable delay circuit, adjusting the adjustable delay circuit in real time to correct for skew between the delayed data signal and the selected data strobe signal.

18. The method defined in claim 17, wherein the timing relationship between the delayed data signal and the selected data strobe signal is characterized by a hold margin and a setup margin, the method further comprising:
with a monitoring circuit that is coupled to the adjustable delay circuit and the delay chain, determining whether the hold margin is greater than the setup margin.

19. The method defined in claim 18 further comprising:
in response to determining that the hold margin is greater than the setup margin, reducing the delay provided by the adjustable delay circuit.

20. The method defined in claim 18 further comprising:
in response to determining that the hold margin is less than the setup margin, increasing the delay provided by the adjustable delay circuit.

* * * * *